US009773515B2

(12) United States Patent
Guzik et al.

(10) Patent No.: US 9,773,515 B2
(45) Date of Patent: Sep. 26, 2017

(54) HGA LOADER WITH OPTICAL ALIGNMENT FOR AUTOMATED MAGNETIC HEAD TESTING

(71) Applicant: Guzik Technical Enterprises, Mountain View, CA (US)

(72) Inventors: Nahum Guzik, Palo Alto, CA (US); Konstantin Perevoztchikov, Saratoga, CA (US); Vladislav Klimov, San Jose, CA (US); Wei Zhuang, San Francisco, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 15 days.

(21) Appl. No.: 15/081,495

(22) Filed: Mar. 25, 2016

(65) Prior Publication Data

US 2016/0307588 A1 Oct. 20, 2016

Related U.S. Application Data

(60) Provisional application No. 62/147,996, filed on Apr. 15, 2015.

(51) Int. Cl.
*G01R 33/02* (2006.01)
*G11B 5/455* (2006.01)
(Continued)

(52) U.S. Cl.
CPC ............ *G11B 5/4555* (2013.01); *G01R 33/12* (2013.01); *G01R 33/1207* (2013.01);
(Continued)

(58) Field of Classification Search
CPC ................ G01R 33/12; G01R 33/1207; G05B 2219/36117; G10H 1/005; Y10T 29/4902; Y10T 29/49021
(Continued)

(56) References Cited

U.S. PATENT DOCUMENTS 6,006,614 A   12/1999  Guzik et al.
7,520,047 B2   4/2009  Collins et al.
(Continued)

OTHER PUBLICATIONS

Guzik Product Bulletin: Guzik V2002 Spinstand with XY-Positioning for Head, Headstack and Disk Testing, Guzik Part No. 02-107178-07, Rev. Sep. 17, 2007.

*Primary Examiner* — Jermele M Hollington
*Assistant Examiner* — Raul Rios Russo
(74) *Attorney, Agent, or Firm* — Burns & Levinson, LLP; Joseph M. Maraia (57) ABSTRACT

An HGA loader provides HGAs, in succession, to a multiple workstation head tester. An HGAs carrier station receives HGAs to be tested. An alignment station on the base includes an alignment surface which selectively rotates about an alignment axis. A camera generates images of an HGA on the alignment surface, which is rotated so that the HGA has a desired spatial orientation which is maintained as the HGA is transferred to an HGA testing workstation. A received, oriented HGA is positioned to enable read/write test operations on a disk rotating on an adjacent spinstand. To effect the successive position operations, a transporter includes a track overlying the workstations, and a carriage movable along the track, to pass from workstation to workstations. The loader is automatically operative under the control of a controller.

15 Claims, 10 Drawing Sheets

(51) Int. Cl.
  *G01R 33/12* (2006.01)
  *G10H 1/00* (2006.01)
(52) U.S. Cl.
  CPC .......... *G10H 1/005* (2013.01); *Y10T 29/4902* (2015.01); *Y10T 29/49021* (2015.01)
(58) Field of Classification Search
  USPC .............................. 324/51, 55, 200, 210, 212
  See application file for complete search history.

(56) References Cited

U.S. PATENT DOCUMENTS

| | | |
|---|---|---|
| 7,529,635 B2 | 5/2009 | Anderson et al. |
| 7,542,868 B2 | 6/2009 | Anderson et al. |
| 8,169,750 B1 | 5/2012 | Guzik et al. |
| 8,176,794 B2 | 5/2012 | Herdendorf et al. |
| 8,611,048 B2 | 12/2013 | Brady et al. |
| 8,873,200 B2 | 10/2014 | Warn |
| 2007/0136021 A1* | 6/2007 | Anderson ............ G11B 5/4826 702/108 |
| 2007/0136022 A1* | 6/2007 | Anderson ............ G11B 5/4826 702/115 |
| 2008/0062564 A1 | 3/2008 | Warn |
| 2012/0200287 A1* | 8/2012 | Warn .................. G11B 5/4555 324/212 |

\* cited by examiner

HGA LOADER WITH OPTICAL ALIGNMENT FOR AUTOMATED MAGNETIC HEAD TESTING

REFERENCE TO RELATED APPLICATIONS

This application is related to U.S. Provisional Patent Application Ser. No. 62/138,105, filed Mar. 25, 2015, and its successor U.S. patent application Ser. No. 15/081,299 (Attorney Docket No. GUZL-0302), entitled "HEAD GIMBAL ASSEMBLY (HGA) SUPPORT CARTRIDGE FOR MAGNETIC HEAD AND DISK TESTERS" (copy attached hereto as Attachment A), filed on even date herewith, and U.S. Provisional Patent Application Ser. No. 62/138,114, filed Mar. 25, 2015, and its successor U.S. patent application Ser. No. 15/080,726, entitled "HEAD GIMBAL ASSEMBLY (HGA) MOUNTING APPARATUS FOR A MAGNETIC HEAD AND DISK TESTER" (copy attached hereto as Attachment B), filed on even date herewith. Those applications are incorporated by reference herein.

FIELD OF THE INVENTION

The present invention relates to magnetic head and disk testers, and in particular to an apparatus that automatically loads a read/write head on a tester.

BACKGROUND OF THE INVENTION

A head/disk tester is an instrument that is used for testing the characteristics of magnetic heads and disks, such as signal-to-noise ratio, track profile, etc. The tester simulates motions of the head with respect to the disk that occur in an actual hard disk drive during operation. A tester comprises a mechanical component, commonly referred to as a spinstand, that performs movements of the head with respect to the disk, and an electronic component, that is responsible for measurement, calculation, and analysis of the measured signal.

Examples of prior art spinstands for a head and disk tester include the Guzik V2002 XY-positioning spinstand and the Guzik S-1701B Micro Positioning spinstand, both of which are available from the assignee of the present disclosure, Guzik Technical Enterprises, 2443 Wyandotte Street, Mountain View, Calif. 94043, USA.

Figure 1:
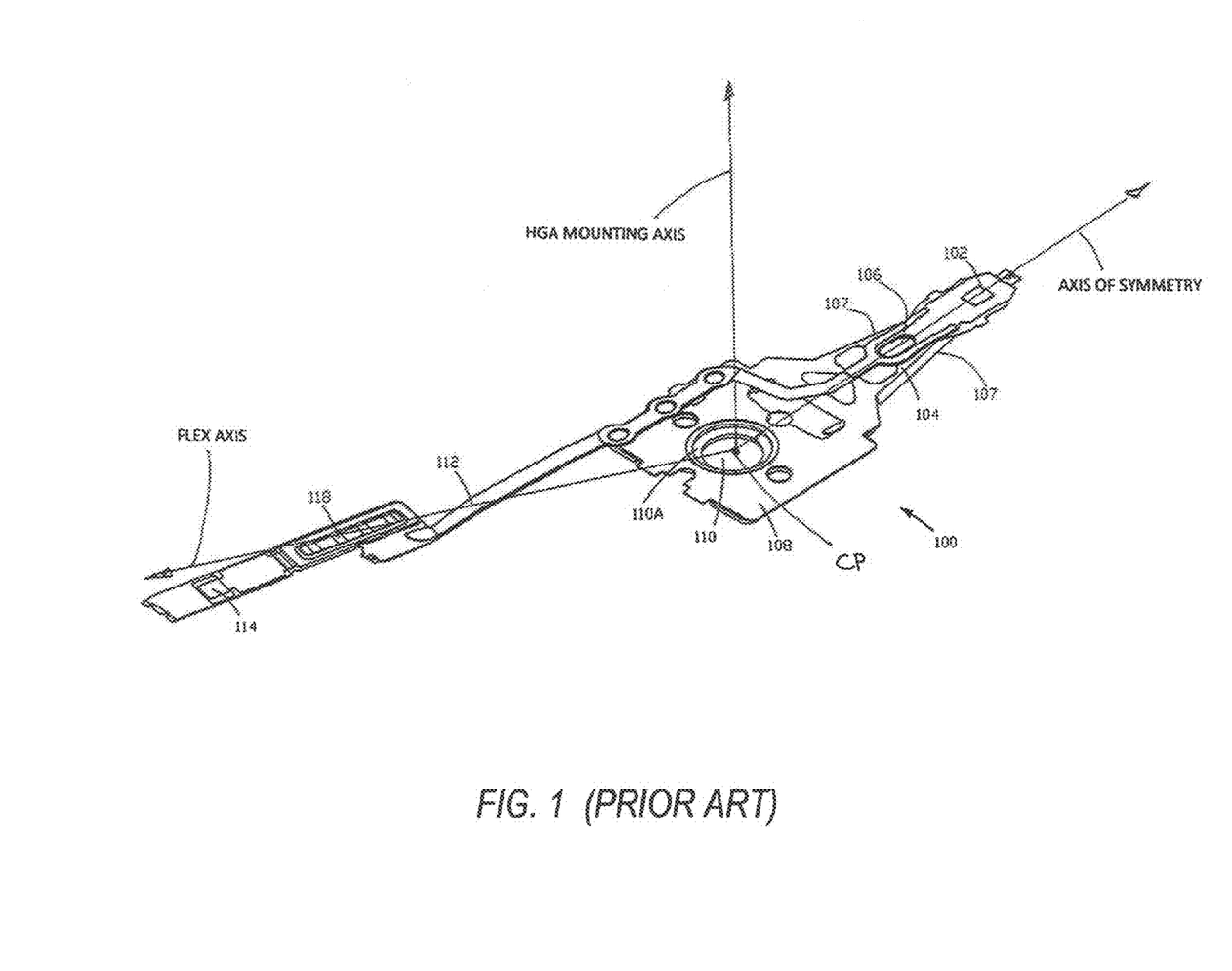
FIG. 1 shows in details a conventional HGA (prior art).

A read/write head is usually incorporated into a head gimbal assembly (HGA), such as shown in FIG. 1. The basic components of an HGA 100 are a head 102, an elongated load beam 104, a tooling hole 106, a base plate 108 having a planar major surface extending between a first edge and a second edge, a boss hole 110 with an angled surface 110A, and a elongated flex circuit support sheet element 112 with an array of electrically conductive pads 118. The boss hole 110 passes through base plate 108 and is characterized by a radius R about an HGA mounting axis perpendicular to the planar surface with center point CP. The boss hole 110 and the tooling hole 106 (sometimes) are used for orientation of the HGA in the X-Y plane. The angled surface 110A of the boss hole 110 is used for clamping the HGA to an HGA support assembly associated with a spinstand. The flex circuit sheet element 112 is used to support electrical connections of the head of the HGA, by way of pads 118, to an external head preamplifier (not shown). Generally, the base plate 108 and load beam 104 are relatively stiff compared to the flex circuit sheet element 112.

In order to test a head with a spinstand, an HGA is loaded to the HGA support assembly associated with the tester. The HGA is mechanically coupled to a corresponding component of the spinstand, and electrically connected to spinstand preamplifiers. To make these operations possible, an alignment of the HGA relative to the spinstand is carried out. After testing, the tested head is removed from the tester.

In the prior art, these steps may be performed by a human operator. Alternatively, some or all of these steps can be automated. Automation is particularly useful in a manufacturing environment, as automation can perform loading faster than a human operator and thus can lead to a greater throughput of heads. Modern heads are particularly susceptible to electrostatic damage. Using automation to perform HGA loading, instead of human operator, helps to avoid such damage and to reduce the loss of the heads.

Various methods and apparatus for automatic loading the HGA to a tester are known in the prior art and are described, for example, in U.S. Pat. No. 7,520,047 "Method and apparatus for loading a read/write head to a spinstand", U.S. Pat. No. 7,542,868 "Head gimbal assembly loader", U.S. Pat. No. 7,529,635 "Method and apparatus for head gimbal assembly testing", U.S. Pat. No. 8,176,794 "Unmounted head gimbal assembly clamping plate", U.S. Pat. No. 8,873,200 "Spinstands for testing a head gimbal assembly", U.S. Pat. No. 8,611,048 "Apparatus and method for receiving and positioning a read/write head to a disk for testing and method of removing a tested read/write head from a test apparatus".

A tester with automatic loading of an HGA, known in the prior art, usually contains a loading area, a precising (or "alignment") area and a test area. A transporter, incorporated in the tester, enables transfer of the tested HGAs from the loading area to the precising area, from the precising area to the test area and, after testing, from the test area back to the loading area. In the loading area, an operator loads and unloads HGAs using some HGA containers. In the precising area, the HGA is aligned with the disk for eventual testing. The components of the precising area are purportedly accurately aligned with corresponding components of the test area, so that the alignment performed at the precising area is retained when the HGA is moved to the test area. In the test area, an electrical connection of the HGA with the preamplifier is established and a dynamic test of the read/write head in association with a disk is performed.

Typically, in the prior art, at a planar surface in an X-Y plane in the precising area, a boss hole pin and a front alignment pin are erected. Both pins are tapered. When an HGA to-be-tested is lowered along the Z direction at the planar surface of the precising area, the HGA's boss hole 110 slips over the boss hole pin and the tooling hole 106 slips over the front alignment pin. As the HGA travels downward, the taper on the pins pulls the boss hole 10 and the tooling hole 106 into their proper positions. The achieved alignment is maintained while the HGA is transferred to the test area. After the transfer to the test area has been carried out, the flex circuit pads 118 of the HGA are generally in the vicinity of the preamplifier terminals and the mechanical structure of the tester attempts to establish an electrical connection between the HGA and the preamplifier terminals, and the preamplifiers.

There are two straight lines that characterize the geometry of an HGA: (a) an axis of symmetry of the HGA's base plate 108 that goes through the centers of the boss hole 110 and the tooling hole 106, and (b) a flex axis that passes through the center point CP of the boss hole 110 and through the array of electrically conductive pads 118 of the flex circuit sheet element 112. The angle between these two lines is not the same for all HGAs—it varies from one type of HGA to another. Accordingly, the position of the pads 118 relative to the axis of symmetry of the HGA's base plate 108 varies— the pads 118 of the flex circuit sheet element 112 of different HGAs are scattered around some nominal (proper) position.

The structure that establishes electrical connection between the pads of array 118 and preamplifier terminals, is designed in such a manner that the terminals of the preamplifier come into contact with the pads 118 of the flex circuit sheet element 112 of an "average" HGA. The pads 118 of a real HGA, which is to be tested, are generally displaced from the "average" position. If the displacement is small enough, it does not hinder the establishment of an electrical connection. If the displacement exceeds a certain value, which is typically of the same order of magnitude as a pad size, then the pads 118 of the HGA's flex circuit sheet element 112 and the preamplifier terminals are spaced apart and are thus mis-aligned so that the needed electrical connection cannot be established for the subject HGA. In this situation, the test fails and, typically, the failed "not-tested" HGA (and its head) is marked as unfit for use.

In the prior art, the "two points alignment" of the HGA, which is performed by aligning the positions of the boss hole 110 (the first point) and the tooling hole 106 (the second point), and which was suggested in the above-cited patents, aligns only the position of the HGA's base plate 108. After that limited alignment, the HGA becomes fixed in the X-Y plane and further alignment is impossible. Any possible shift of the circuit pads of array 118 in relation to the preamplifier terminals however remains unchanged, so that the pads cannot be brought into contact with the preamplifier terminals. This is particularly important since the circuit sheet element 12 relatively compliant/flexible compared to the relatively stiff base plate 108 and load beam 104. If the load beam 104 and base plate 108 are fixed, as in the prior art, the pad array 118, at the distal end of the flexible circuit sheet element is simply not known/controlled. Attempts to establish an electrical connection fail often enough for this reason, so that significant numbers of possibly good, but untested, heads are baselessly rejected as flawed, because of their inability to connect the HGA to preamplifier terminals, and are erroneously discarded. This is an important disadvantage of prior art HGA loaders.

There are several ways suggested in the prior art, to overcome the adverse effect of the positional errors of the HGA flexible circuit sheet element upon test results (see, for example, the U.S. Pat. No. 7,529,635, entitled "Method and apparatus for head gimbal assembly testing"). It has been suggested that the area of preamplifier terminals be widened, to enable a higher likelihood of successful interconnection with the flex circuit pads 118. By using contacts with an area that covers the tolerance range of flex circuit location, one may ensure that the flex circuit pads 118 touch the preamplifier terminals, when they are pressed together.

Another suggestion has been to terminate each of the preamplifier conductors, which are to contact the same flex circuit pad, with two pogo pins. The use of two pogo pins for one conductor permits the flex circuit pad to contact one of them, even when the flex circuit 112 is not optimally aligned. This would increase the variance permitted in the positioning of the flex circuit 112. However, for increasingly needed high density connector pad arrays, it is not possible to accommodate error tolerances in the position of the pad arrays 118.

Figure 2A:
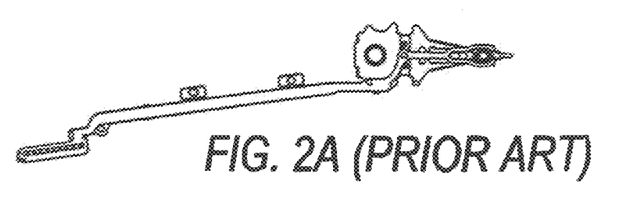
FIGS. 2A-2C show different types of HGAs (prior art).
Figure 2B:
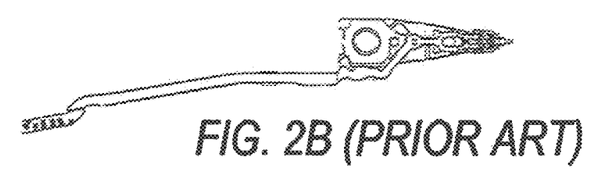
Figure 2C:
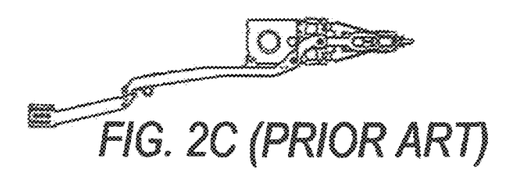

The trend of increasing track density on a disk, has led to new methods of magnetic writing, such as those encompassing preheating of the media. Such new techniques have introduced new components (a heater, a laser and so on) to read/write heads, so that the number of head inputs/outputs is increased. This causes a corresponding increase of the number of pads on an HGA flex circuit 112. Some manufacturers have begun to produce HGA's with flex circuit pads 118 arranged in several rows (see FIG. 2B and FIG. 2C, for example). For this reason, the described suggestions cannot be used in the needed contemporary HGA loaders, and the problem of elimination (or at least reduction) of the flex circuit sheet element 112 positioning-caused errors, remains urgent.

SUMMARY

According to the present invention, an alignment of an HGA is performed in two steps. As a first step, improved translation alignment is effected by more accurately centering an HGA boss hole 110 of an HGA to be tested. As a second step, improved angular alignment of the HGA to be tested is achieved whereby the HGA is angularly displaced around the center of the boss hole 110, so that the pads 118 of the HGA flex circuit sheet element 112 (rather than the magnetic head at the end of the load beam 104 as in the prior art) are placed in the required position as well. In this way, the possible displacement of the flex circuit pads of array 118 relative to preamplifier terminals, is prevented and a principal reason for unjustified rejection of the tested read/write heads is eliminated.

Additionally, according to the present invention, after the alignment of an HGA is accomplished, the HGA is disengaged from adjacent components in a novel manner. In that way, when the HGA is raised before the transfer to a next workstation, friction between the inner facing surface of HGA boss hole 110 with the supporting parts, is eliminated, so that a possible cause of alignment infringement is removed.

In the mounting structure, among other operations, the HGA flex circuit sheet element 112 is flattened and fastened to the mounting surface prior to testing. According to the present invention, the mounting structure is configured in such a way that the procedure of flattening and fastening is applied not to just a portion of the whole flex circuit sheet element 112, but to the whole flex circuit sheet element 112, including the part that contains the pads 118. In that case, the pads of array 118 become immovable, and that increases the accuracy of engagement of the pads of array 118 with the preamplifier terminals, as well as eliminates the possibility of pads scratching during establishing electrical connection.

DETAILED DESCRIPTION

Figure 3:
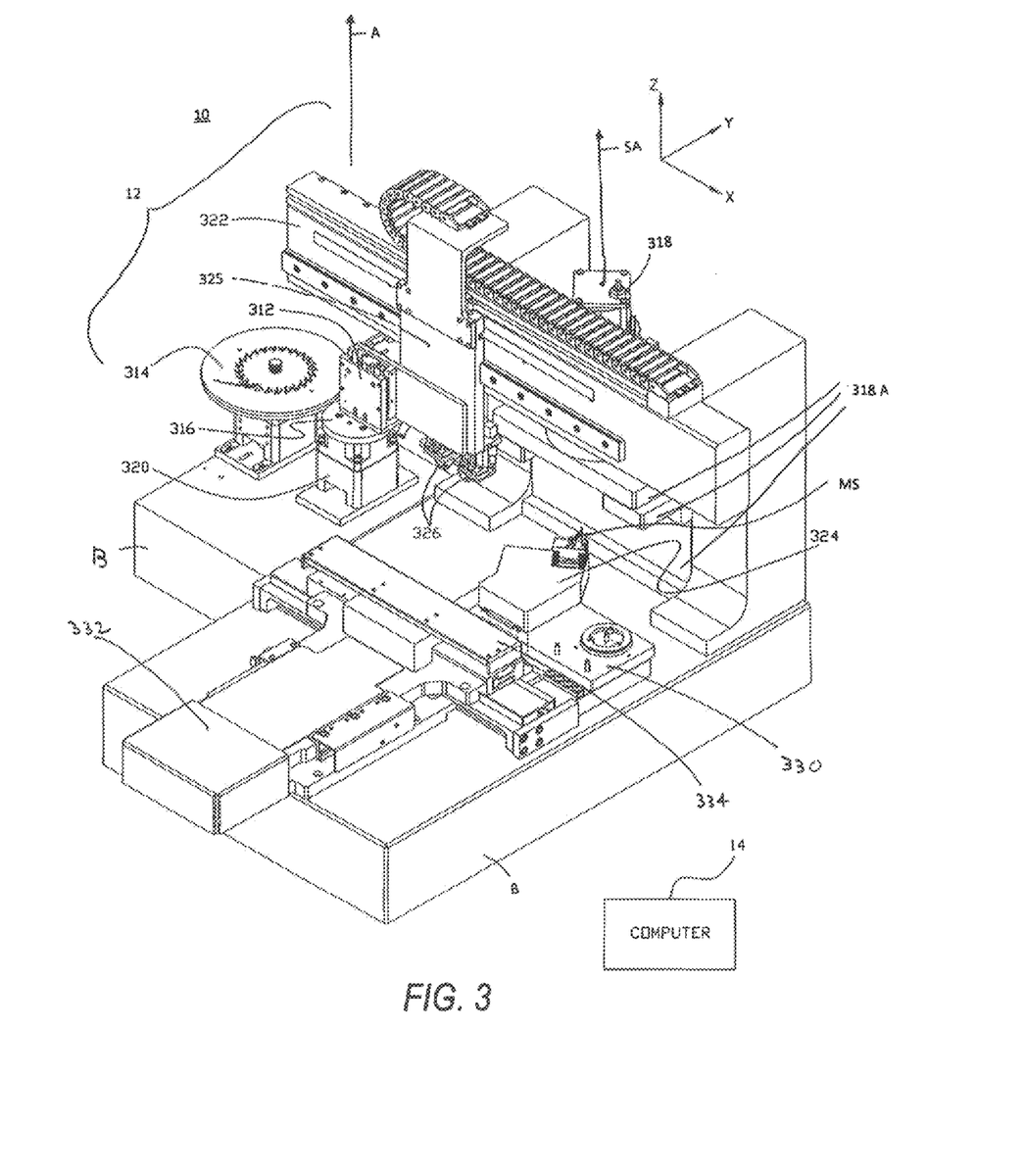
FIG. 3 shows a general view of a part of a tester that contains components of an embodiment of the present invention.

FIG. 3 shows an overview of a portion of a head and disk tester 10, having multiple components that form an HGA loader 12 according to an embodiment of the present invention. An X-Y-Z coordinate system is shown in FIG. 3 for directional references. Head and disk tester 120 is includes a base B upon which a spinstand 318 including its support structure 318A and rotary drive motor 318B (318A and 318B are not clearly shown in FIG. 3, but are clearly shown in the alternative head and disk tester 12 shown in part in FIG. 3B) are positioned along with HGA loader 12. The spinstand support structure 318A includes a magnetic disk support structure for attaching one or more magnetic disks and coupling the attached disk(s) for spinning about a spin axis SA (parallel to the Z axis) by motor 318B during testing of an HGA.

The HGA loader 12 comprises three principal workstations aligned along a work axis W, where W is parallel to the X axis. The first workstation is an HGAs carrier 314 having a planar top surface in an X-Y plane for receiving and supporting HGAs to be tested, preferably in a single layer array. The second workstation is an alignment table 316 having a planar top surface (TS) in an X-Y plane for receiving HGAs one at a time. The alignment table 316 has an associated rotary actuator 320 for angularly displacing the top surface of the alignment table 316 together with a received HGA thereon, about an alignment axis A parallel to the Z axis, to align the received HGA to a test orientation. The third workstation is a mounting structure MS on a mounting structure support 324 affixed to an X-Y transport plate 330, for receiving oriented HGAs one at a time on mounting support MS, and supporting the received oriented HGAs in a desired angular position in relation to a disk on spinstand 318, for testing while maintaining the test orientation of the HGA. An Y transport assembly 332 and an X transport assembly 334 are disposed on a top-facing surface of base B of head and disk tester 10 and are configured in a conventional manner to selectively displace the X-Y transport plate, and thus, in turn, mounting support gross motion in the X-direction and Y-direction from an initial (HGA receiving location along workstation axis W) to a test position with an HGA on mounting structure MS opposite a spinning (about spin axis SA) disk-to-be-tested at spinstand 318.

The mounting structure MS in FIG. 3 is, for example, of the type of apparatus shown in U.S. Provisional Patent Application Ser. No. 62/138,114, filed Mar. 25, 2015, and its successor U.S. patent application Ser. No. 15/080,726 (Attorney Docket No. GUZL-0303, filed on even date herewith, both incorporated by reference herein. Other types of mounting structures for clamping an aligned HGA can be used as well.

Figure 3A:
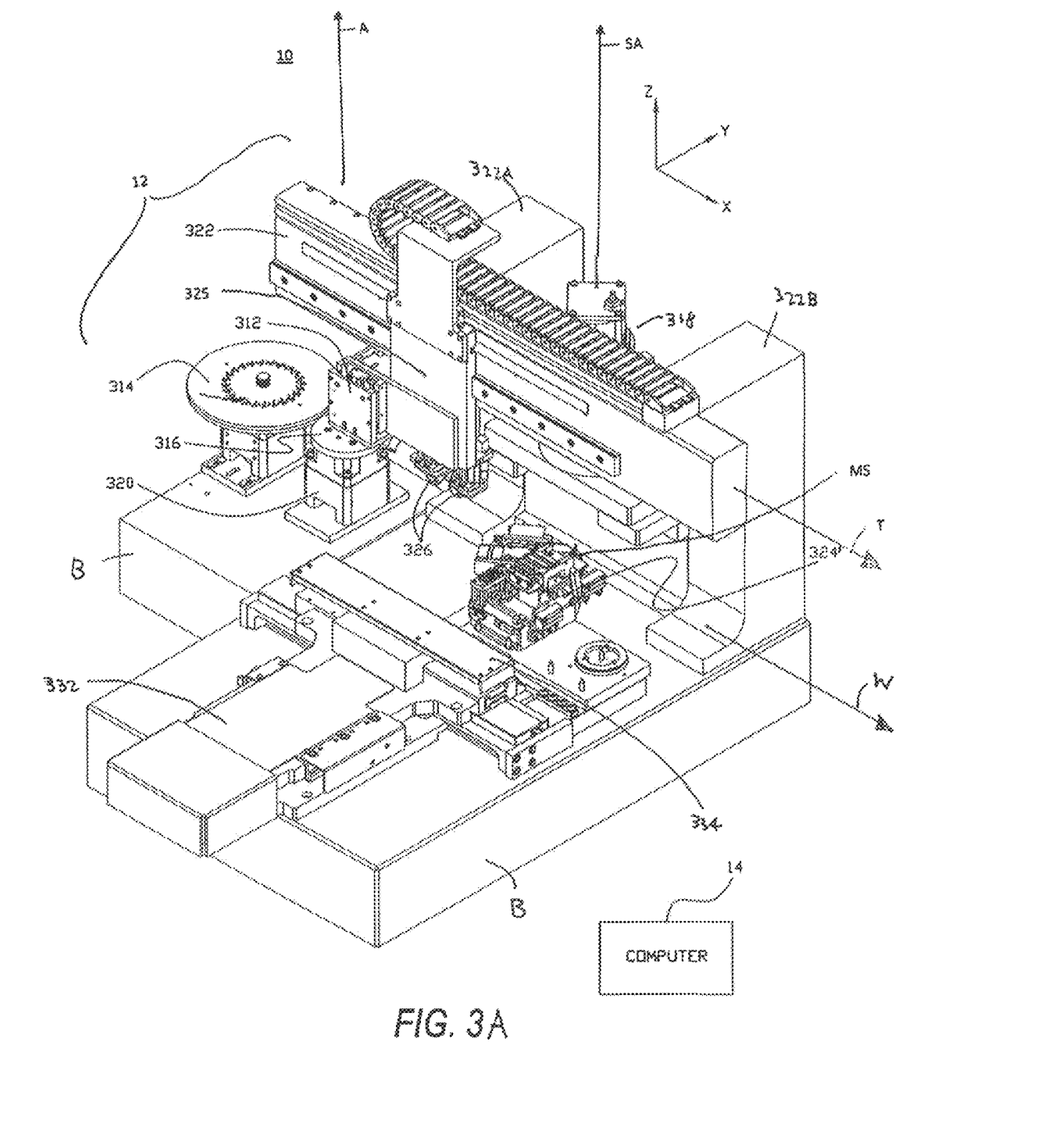
FIG. 3A shows a general view of a part of a tester that contains components of an alternative embodiment of the present invention.

A transporter 322, supported by support structures 322A and 332B extending from base B, includes a carriage 325 that is moveable along a track axis T that is parallel to the X axis. Carriage 325 carries a digital camera 312 and pickers 326 with vacuum-operated fasteners, and is operable operative over and across a top-facing surface of head loader 12 of tester 10, and particularly along the transport axis T overlying carrier 314 of the first workstation, alignment table 316 of the second workstation and mounting structure MS of the third workstation. Transporter 322 selectively picks up and transfers HGAs to, from and between the components 314, 316 and MS. As set forth below, transporter 322 particularly transports an HGA picked from alignment table 316 which has been angularly aligned to a desired testing angle about alignment axis A, and places that HGA on mounting structure, while maintaining the alignment of the HGA at all times at the angular orientation at the alignment table 316. Since an HGA transported by transporter 322 is aligned for testing at alignment table 316, it is not absolutely necessary the HGA be transported from the HGA carrier 314 to alignment table 316 while maintaining any particular alignment, or even by the same transporter as in the table 316-to-MS transport step. However, in the two different embodiments illustrated in FIGS. 3-3B, the transporter 322 operates over a unitary track along axis T. That track is linear over and between each of components 314, 316 and MS, so that rough pre-alignment at HGA carrier 314 enables smaller fine adjustment at table 316, and is advantageous.

A computer 14 controls the head tester 10, and among other things, monitors and controls the interaction of the workstations of HGA loader 12 and the transporter 322, and carries out other operations well. For example, the other operations may include control of the spinstand, control of interconnections of test equipment to mounted HGAs, and the actual testing of HGAs once they are disposed on mounting structure MS.

Figure 3B:
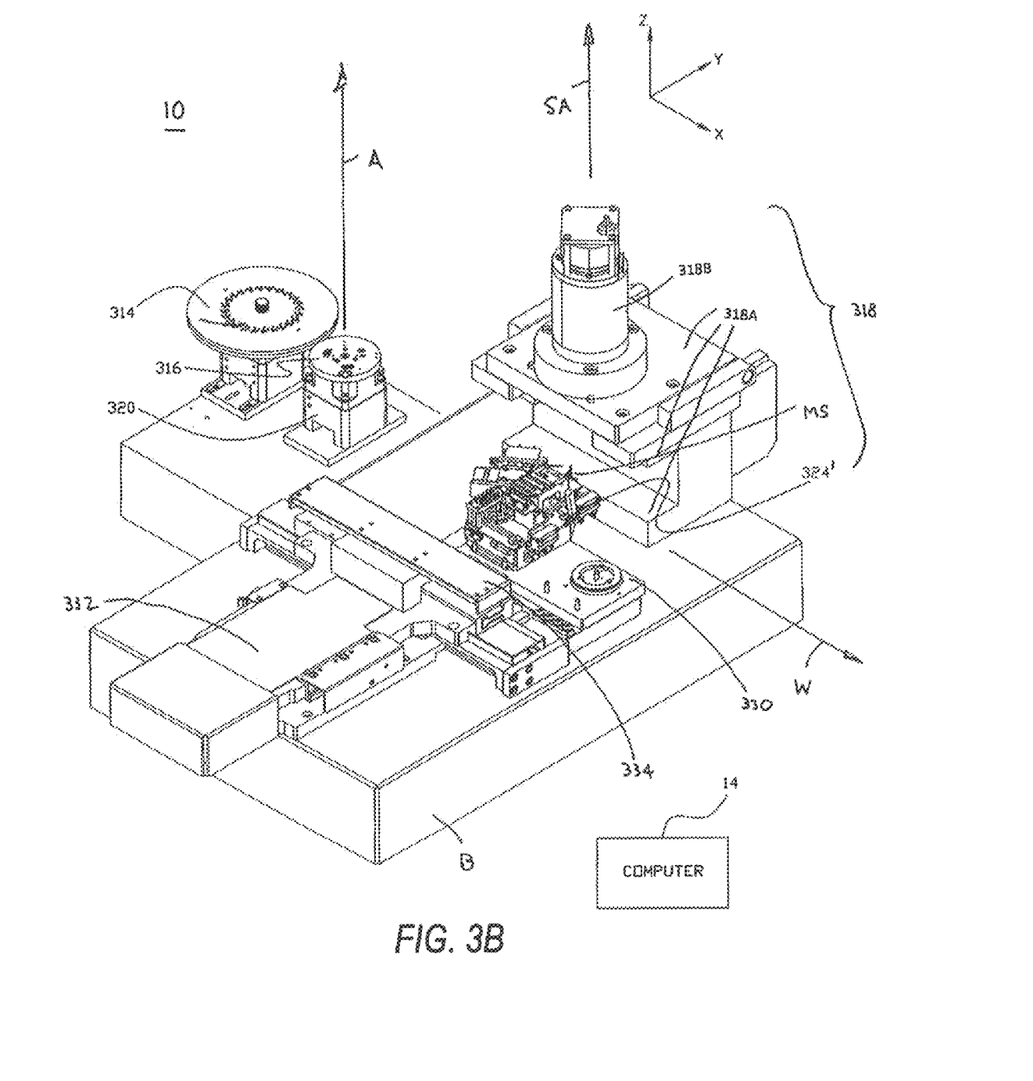
FIG. 3B shows the tester of FIG. 3A with the transporter 322 and its support structure 322A, 322B removed to show the spinstand residing behind the transporter as viewed in FIG. 3A.

FIGS. 3A and 3B shows an exemplary alternative form of head and disk tester 10 with the same components except for an alternative form of the mounting structure support at the third workstation, that is, the cartridge-type mounting structure support 324' which is substituted for the simple block element mounting structure support 324 in FIG. 3.

The cartridge-type mounting structure support 324' in FIGS. 3A and 3B is of the type of apparatus shown in Provisional Patent Application Ser. No. 62/138,105, and its successor, U.S. patent application Ser. No. 15/081,299 (Attorney Docket No GUZL-0302), filed on even date herewith, both incorporated by reference herein.

The cartridge-type mounting structure support 324' in FIGS. 3A and 3B is a unitary cartridge, or module, providing a self-contained, high accuracy, ready-to-use assembly for controlling fine positioning of an HGA-bearing head mounting unit mounted on the cartridge, with respect to a spinstand or other device associated with a head and disk tester 10.

Again, as in FIG. 3, the mounting structure MS in FIGS. 3A and 3B is of the novel "collet" type of apparatus shown in U.S. Provisional Patent Application Ser. No. 62/138,114, filed Mar. 25, 2015, and its successor U.S. patent application Ser. No. 15/080,726 (Attorney Docket No. GUZL-0303, filed on even date herewith, both incorporated by reference herein. Other types of mounting structures for clamping an aligned HGA can be used as well.

In operation, a set of HGAs to be tested is initially mounted by an operator, human or robotic, on the HGAs carrier 314. Thereafter, the operator, again, human or robotic, may initiate a sequential automatic test of the HGAs (one HGA after another). A next HGA to be tested is picked up from the HGAs carrier 314 by the pickers 326 of transporter 322 and is transferred to alignment table 316. The alignment table 316 interacts with the TV digital camera 312 and rotary actuator 320, to carry out alignment of the HGA in the X-Y plane. The aligned-for-testing HGA is transferred by the pickers 326 of transporter 322 from the alignment table 316 to the mounting structure MS, with the angular orientation of the HGA in the X-Y plane being maintained unchanged during the transfer. In the mounting structure MS, the base plate 108 of the HGA, is clamped to a mounting surface, the flex circuit 112 is straightened out, followed by fastening to a mounting surface, and the pads 118 of the flex circuit 112 are connected to terminals of a preamplifier (or, what is the effectively same, to pins of a preamplifier pogo pin connector which are electrically connected to the preamplifier). A dynamic test of the HGA in association with a disk is carried out. After completion of the test, the tested HGA is transferred by the transporter 322 back to the HGAs carrier 314.

The mounting structure MS, for example, of the type shown in Provisional Patent Application Ser. No. 62/138,114 (the "'114 application"), and its successor US non-provisional application filed on even date herewith, both incorporated by reference herein, consists of a clamping unit (a so-called "collet assembly") and an interconnection unit IU. The clamping unit clamps the HGA to a mounting surface and the interconnection unit IU connects the pads 118 of the HGA flex circuit 112 to terminals of the preamplifier or other test equipment. The alignment of the HGA being tested at a given time, brings that HGA close to a so-called "reference position". The reference position is a position of the HGA at the alignment table 316 which ensures that after transfer to the mounting structure MS: (i) the HGA boss hole 110 is centered at a symmetry axis of the clamping unit of the mounting structure MS, and (ii) the pads 118 of the HGA flex circuit 112 are directly under the pogo pins of preamplifier terminals that are located on the interconnection unit IU. With this configuration, the successful clamping of an HGA to the mounting surface, and connection of the pads 118 of the HGA to the preamplifier terminals, are established.

During a test, the next HGA to be tested is brought to the required position by an alignment procedure that has two stages. The first stage of alignment effects a translation of the HGA, bringing the center of the HGA boss hole 110 into the required position on alignment table 316. After that operation, a second stage of alignment, a rotation around the center of the HGA boss hole 110, brings the pads 118 of the HGA flex circuit 112 into their required position.

The second stage of alignment—the angular alignment of the pads 118—utilizes a preparatory operation that creates a reference image, that is, an image of the HGA localized in the reference position for each type of HGA to be tested on the tester. Creation of the reference image is performed one time only, before testing of HGAs of the respective type begins.

The relative positions of the alignment table and the mounting structure MS are known in advance and do not change in time. As a consequence, the expected location of the symmetry axis of base plate of the HGA in the reference position is calculated. After such location is calculated, one HGA, of the type under consideration, is transferred from the HGAs carrier 314 to the alignment table 316. The HGAs carrier 314 ensures that the boss hole is positioned in the vicinity of the pin at the center of alignment table 316, so that it slides onto that pin. Then, an image of the HGA is produced by the digital camera 312 and the symmetry axis of the HGA in this image is determined. Comparison of the symmetry axis of the received image with the expected location of the symmetry axis, is used to determine an angular discrepancy w between those axes. A rotation of the alignment table by angle w brings the HGA to a position that is an approximation of the reference positions.

In general, the approximate reference position, determined in the above-described manner, is not sufficiently precise, and further refinement is necessary. This refinement is fulfilled by the following sequence of operations:

a. an impression of the location of the preamplifier terminals (or the preamplifier pogo pin connector) is produced by pressing the preamplifier terminals to a pressure sensitive material placed on the mounting structure MS underlying the preamplifier terminals.

b. the digital camera 312 generates an image of the preamplifier terminals impression.

c. one of the HGAs of the set to be tested, is placed on the alignment table and an approximate alignment of the HGA is performed.

d. the HGA is transferred to mounting structure MS and its image is produced by the digital camera 312.

e. the image of the HGA at the mounting structure MS is compared with the image of the preamplifier terminals impression, and the angle φ between them is measured.

f. the HGA is transferred from the mounting structure MS to the alignment table 316 with its position in the X-Y plane unchanged.

g. the alignment table 316 together with the HGA so-placed on table 316, is turned by the rotary actuator 320 by an angle φ.

h. an image of the HGA placed at the alignment table 316 is produced by the digital camera 312, and that image is saved in memory as a reference image for the specific type of HGAs.

After the reference image has been created, the angular alignment of any HGA of the chosen type becomes possible. The angular alignment of the next HGA from the set of that type to be tested, is performed as a sequence of repeated steps. At each step, the digital camera 312 produces an image of the HGA which is held (by vacuum) to the upper surface of the alignment table 316. A comparison of the received image of the HGA with the reference image of HGA, determines the angular discrepancy between them. The rotary actuator 320 turns the alignment table 316 together with the HGA, which is held to the alignment table 316, in a direction and amount to reduce the determined discrepancy. This is the end of the current step. That sequence of described steps brings the HGA close to the reference position, so that the goal of the alignment is achieved.

Operations performed by or at the components of the HGA loader 12 according to an embodiment of the present invention, and the components themselves, will now be described in more detail.

In order to transfer an HGA from one component to another, the transporter 322 operates to position a picker 326 above the HGA-to-be-transferred at a first component, namely, one of HGAs on carrier 314, alignment table 316 and mounting structure MS. Then, the transporter 322 first lowers a picker 326 so that it engages the HGA-to-be-transferred, and then uses a vacuum fastener of the lowered picker to couple to the HGA, and, finally, raises the picker 326 together with the coupled HGA.

Transporter 322 then translates the picker 326 together with the coupled HGA over and across the deck of the tester so that the picker 326 with the coupled HGA overlie a desired different one of the components 314, 316 and MS. Transporter 322 then lowers the picker to the component, cuts the vacuum to release the HGA from the vacuum fastener, and raises the picker 326. All steps including and after the pickup of the HGA from the alignment table 316 are performed while maintaining the angular orientation of the coupled HGA.

FIGS. 4A-4D further show digital camera 312 affixed to transporter 322 (movable along the x axis). Digital camera 312 is shown with its components in more detail than in FIG. 3, with a view from a different angle than that of FIGS. 3-3A. With this configuration, digital camera 312 selectively rides by the transporter 322 in the direction of axis T (parallel to the X axis), under control of computer 14. As shown in FIGS. 4A-4D, digital camera 312 is positioned over the alignment table 316. The objective lens of the digital camera 312 faces downward (as illustrated), facing the HGA on alignment table 316. The objective lens is surrounded by a ring-shaped illuminator 410 that projects light at the HGA on table 316.

In the illustrated form, a tail pusher assembly F for flattening the flex circuit 112 (of the HGA on table 316) against the upper surface of the alignment table 316, and holding it in a fixed position on table 316, is rigidly coupled to transporter 322. That tail pusher assembly F includes (i) a linear actuator 414 disposed on carriage 325 of transporter 322, (ii) a driven element 414A having two parallel arms 414B extending transverse to the Z axis, (iii) a pressing rod 412, and (iv) a pair of flat springs 416. Driven element 414A is adapted to be selectively driven in the Z direction by actuator 414, under the control of computer 14. In another form, the flex circuit flattening tail pusher assembly F is mounted to the base, but otherwise works in a similar manner.

The flat springs 416 couple distal ends of the two arms 414B to opposite ends of the pressing rod 412 so that the pressing rod is transverse to the Z axis but generally parallel to the table 316.

Figure 4A:
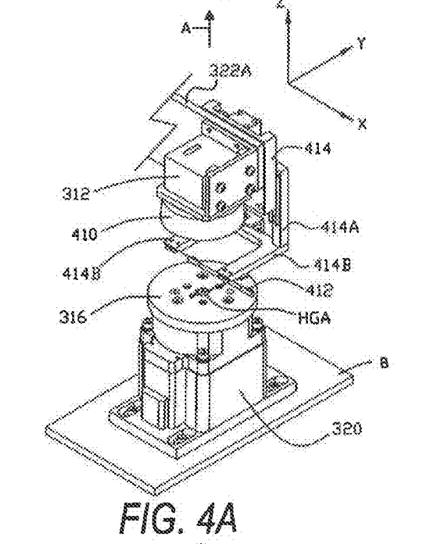
FIGS. 4A-4D illustrate the use of the digital camera.
Figure 4B:
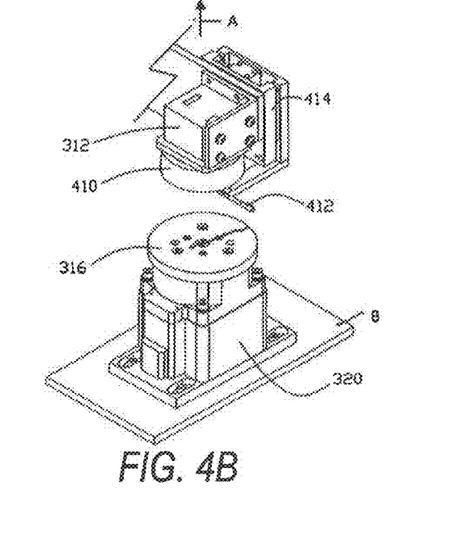
Figure 4C:
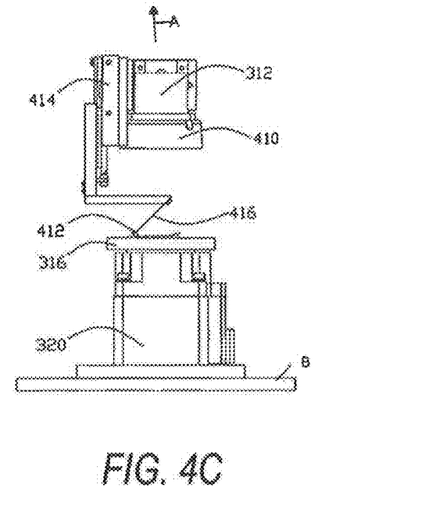
Figure 4D:
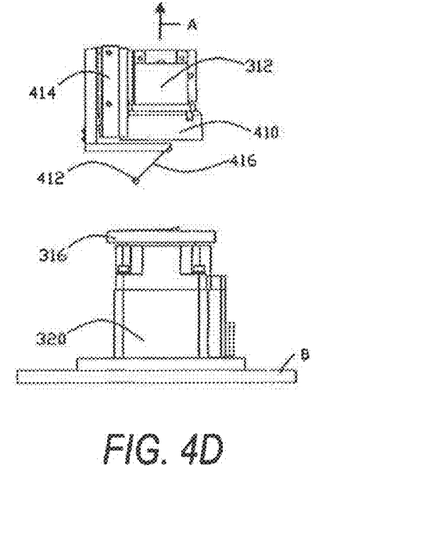

In operation, in order angularly orient the HGA 100 on alignment table 316 with a desired orientation, and enable digital camera 312 to generate an image of the oriented HGA 100 on table 316, computer 14 first controls the transporter 322 to position the digital camera 312 to overlie the alignment table 316 with the objective lens of the camera being opposite the HGA, and the pressing rod 412 of tail pusher assembly F overlying and transverse to the flex circuit 112 of the HGA, with the driven element 414A of the actuator 414 being an uppermost position (as shown in FIG. 4B and FIG. 4D). In this position, the pressing rod 412 is vertically spaced apart from the flex circuit 112 of the HGA 100.

Then, computer 14 controls linear actuator 414 to reposition driven element 414A to a lowermost position (shown in FIG. 4A and FIG. 4C), again with the objective lens of the camera being opposite the HGA, and the pressing rod 412 overlying and transverse to the flex circuit 112 of the HGA, but with the pressing rod 412 biased (by flat springs 416) against the flex circuit 112, pressing it against the top surface of table 316. The digital camera 312 then generates an image of HGA 100 on the table 316.

Computer 14 then controls linear actuator 414 to return driven element 414A of the actuator 414 to its uppermost position (as shown in FIG. 4B and FIG. 4D) so that pressing rod 412 is again vertically spaced apart from the flex circuit 112 of the HGA.

Computer 14 then controls actuator 320 to rotationally displace table 316 by angle φ, so HGA 100 has the desired orientation. Then, pickers 526 return to overlie HGA 100 and are driven down to press base plate 108 against the top surface TS of table 316, and the vacuum holding HGA 100 to the top surface TS is released, and the vacuum to pickers 326 is restored. At that point, while base plate 518 is pressed against top surface TS, pin 518 is withdrawn downward, and pickers 526 lift the oriented HGA 100 and transport it along track T to the third workstation, while maintaining the orientation of HGA 100. Because base plate 108 is biased against and firmly held to top surface TS, as the pin 518 is withdrawn, incidental interfering engagement of the edges of boss hole 110 and the lateral surfaces of pin 518 do not cause any lateral displacement or change in the orientation of HGA 100.

Figure 5:
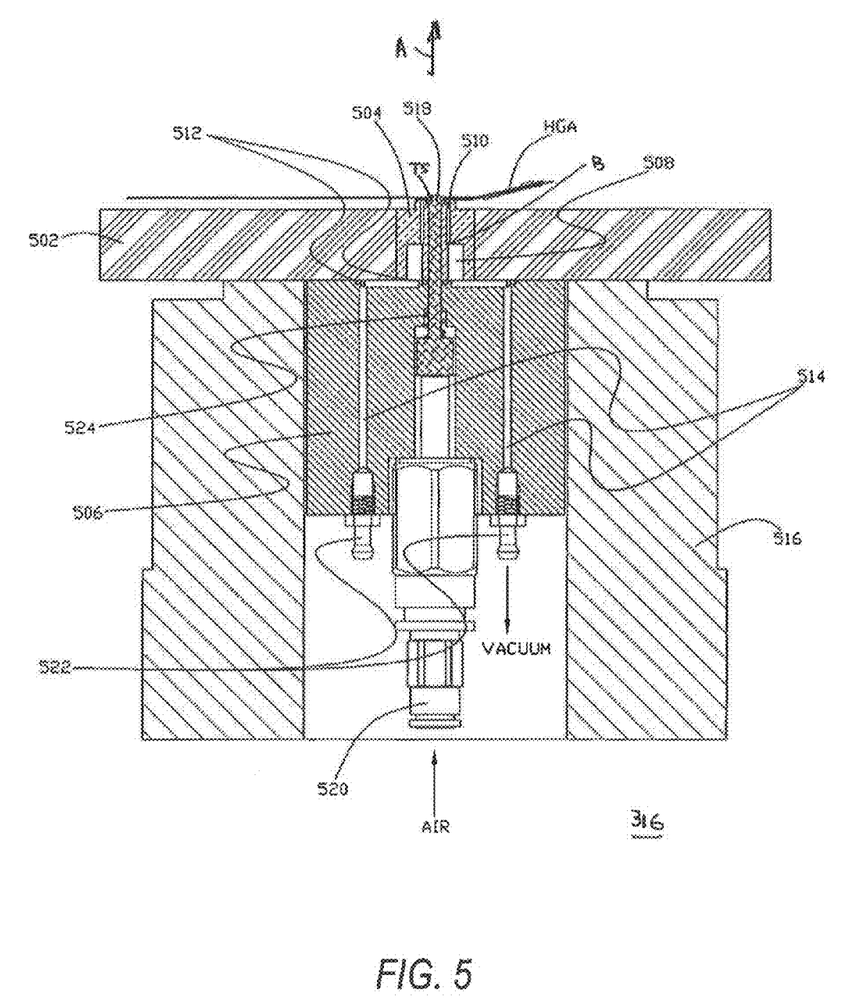
FIG. 5 shows a cross section of an alignment table according to an embodiment of the present invention.
Figure 6:
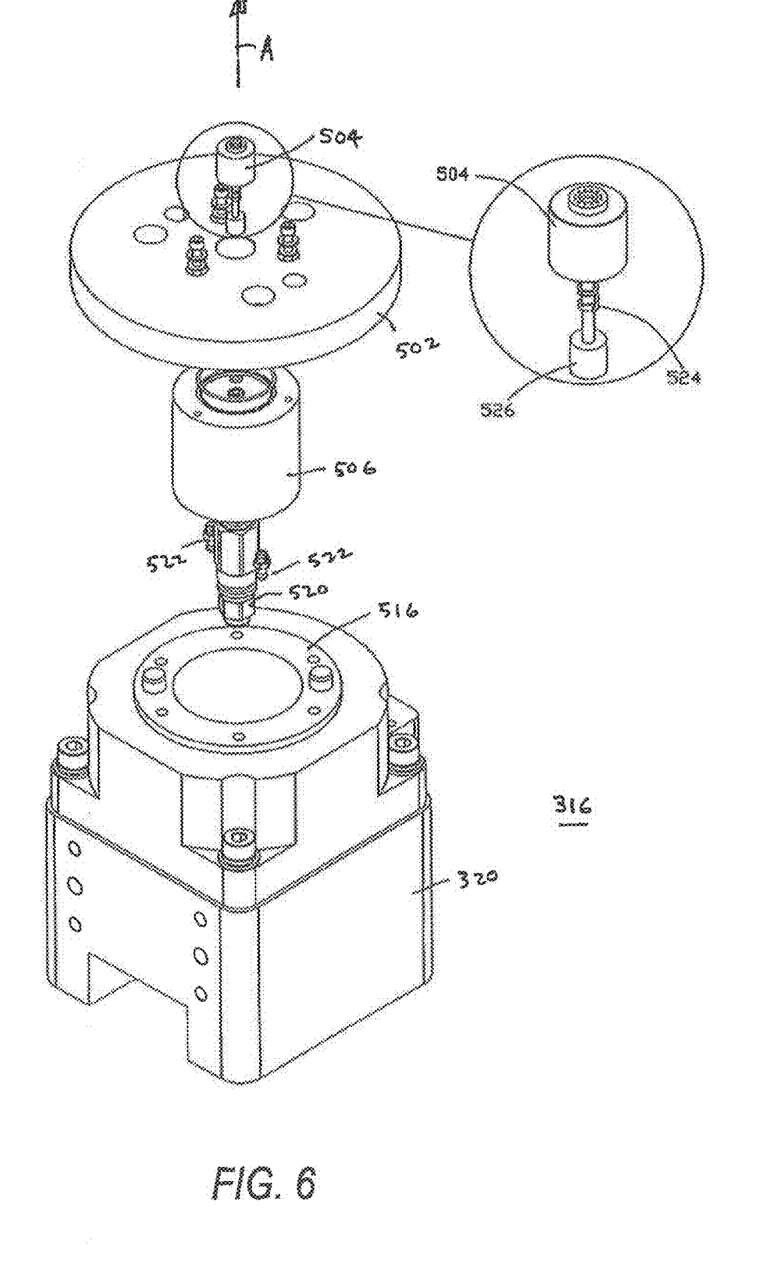
FIG. 6 shows separate components of an alignment table according to an embodiment of the present invention.

A cross-section of the exemplary alignment table 316 is shown in FIG. 5 with respect to the alignment axis A, parallel to the Z axis. The separate components of the alignment table 316 and the rotary actuator 320 are shown in FIG. 6. The alignment table 316 comprises a rotatable disk 502 rigidly coupled to a revolving part 516 of the rotary actuator 320. In the center of the rotating disk 502, a suction bushing 504, perforated by sucking (vacuum) conduits 510, is built-in. The suction bushing 504 defines at its uppermost surface, the planar, annular top surface TS for supporting (as shown in FIG. 5) surface of the base plate 108 of an HGA 100 mounted thereto.

The rotating disk 502, the suction bushing 504 and a cylindrical insert 506, define a vacuum chamber 508 with sealing O-rings 512. Exhausting channels 514 connect the vacuum chamber 508 with vacuum inlets 522. Vacuum applied by way of inlets 522 effect a holding force to the base plate of the mounted HGA 100, biasing the HGA against the top surface TS.

There is a central bore B in the suction bushing 504, which contains a retracting pin 518 with a tapered top end and broadened bottom end. As noted above, the pin 518 is moveable up and down along the alignment axis A, as described below. The space under the retracting pin 518 is coupled through an inlet 520 to a source of pressurized air (not shown). A spring 524 (see FIG. 6) is placed between the broadened bottom end of the retracting pin 518 and the cylindrical insert 506.

Before the transporter 322 brings a next HGA to the alignment table 316, pressurized air at the inlet 520 is switched on. Under the action of the pressurized air, the retracting pin 518 moves upward to an uppermost position so that the tapered end of the retracting pin 518 extends beyond an upper surface of the suction bushing 504. In operation, an HGA (carried by picker 526 extending downward from carriage 325) is lowered onto the top surface of the alignment table 316 along the direction of the alignment axis A (parallel to the Z axis) by the transporter 322. As the HGA approaches the top surface of table 316, the picker 526 causes boss hole 110 of the HGA to slip over the tapered end of the retracting pin 518. In response to continued downward motion of picker 526, base plate 108 passes over the tapered end of the retracting pin 518, and pin 518 pulls the boss hole 110 into its proper location, causing a corresponding translation of the HGA in the X-Y plane and bringing the center point CP of the HGA boss hole 110 into the required position with the HGA mounting axis coaxial with the alignment axis.

After the HGA 100 is placed on the top surface TS of the alignment table 316, vacuum is switched on, and applied to vacuum inlets 522. The vacuum passes through the exhausting channels 514, through the vacuum chamber 508, through the sucking conduits 510 and creates a low pressure above the upper surface of the suction bushing 504. In response to that low pressure, the base plate 108 of HGA 100 is pulled down to (or biased against) the planar, annular top surface TS of the suction bushing 504 and is locked there, so that any displacement in the X-Y plane is prevented. Before removing the HGA 100 from the alignment table 316, pressurized air is applied to inlet 520 and the delivery of vacuum to the vacuum inlets 522 is terminated. With these changes in pressure, the force of the spring 524 causes the retractable pin 518 to move downward to a lowermost position under the upper surface of the alignment table 316. The absence of vacuum frees the HGA so that the transporter 322 is able to raise the HGA and to transfer it from the alignment table 316 to the mounting surface MS for testing, all without changing the angular orientation of the HGA.

The advancement of the retractable pin 518 to its lowermost position eliminates possible friction between the inner surface of HGA boss hole 110 and external surface of the retractable pin 518 during the lifting of the HGA by the transporter 322. Such friction might otherwise create forces which would displace the HGA in X-Y plane and damage the accomplished alignment, a result that is undesirable.

The mounting support MS is a part of a cartridge 324 incorporated in the tester, and contains a clamping unit and an interconnection unit. The clamping unit can be a well known component of a HGA loader, or it may be of the type disclosed in the '114 application incorporated by reference herein.

Figure 7A:
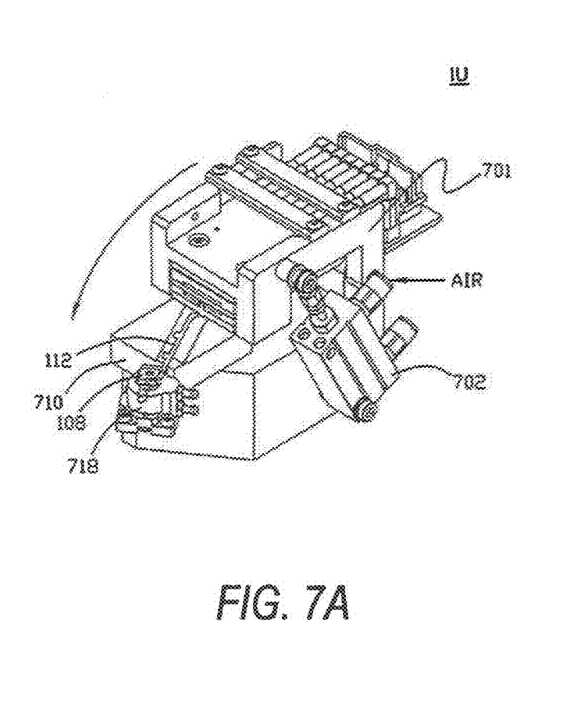
FIGS. 7A-7B show an interconnection unit of the embodiment of Figs.
Figure 7B:
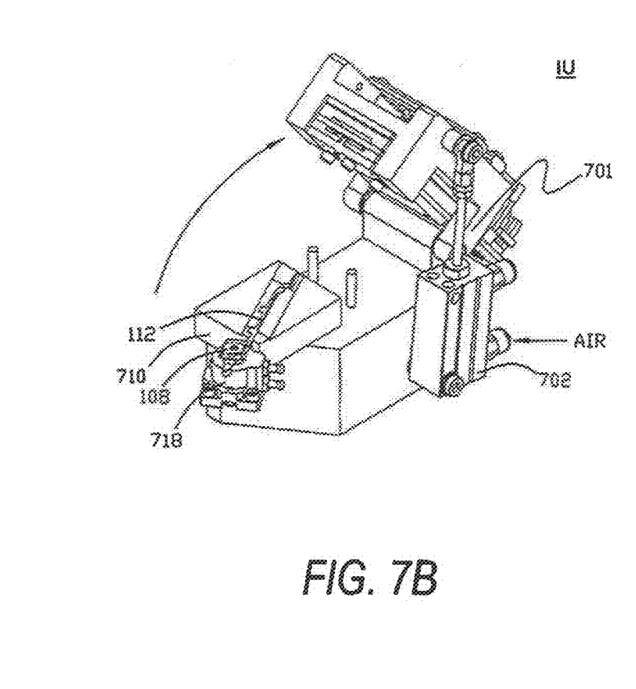

The interconnection unit IU according to the present invention is shown in FIGS. 7A-7B. The interconnection unit has a moving part 701 that may be turned up (as in FIG. 7B) and down (as in FIG. 7A) around a horizontal axis by an air-operated actuator 702. Preamplifier terminals are mounted at the bottom surface of the moving part 701.

Before the transporter brings a next HGA to the mounting support MS, the moving part 701 is turned up, as shown in FIG. 7B. Then, the oriented HGA 100 is lowered to mounting support MS and released by pickers 526, so that the HGA base plate 108 is positioned at the clamping unit. At the same time, the flex circuit 112 of the HGA is positioned on a surface of an adjacent bench 710. Vacuum ports hold the flex circuit 112 against the clamping unit. The clamping unit of the mounting support MS clamps the HGA base plate 108 to a mounting surface. In the interconnection unit IU, the flex circuit 112 of the HGA is flattened and fastened to a mounting surface of the interconnection unit IU. The moving part 701 rotates down to its original position 7A and presses preamplifier terminals of the clamping unit (preferably, pogo pin connectors) against the pads 118 of the flex circuit 112, establishing the desired electrical connection.

Figure 8A:
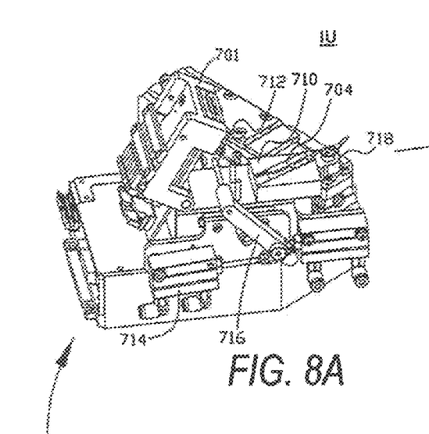
FIGS. 8A-8C show the rear side of an interconnection unit according to an embodiment of the present invention.
Figure 8B:
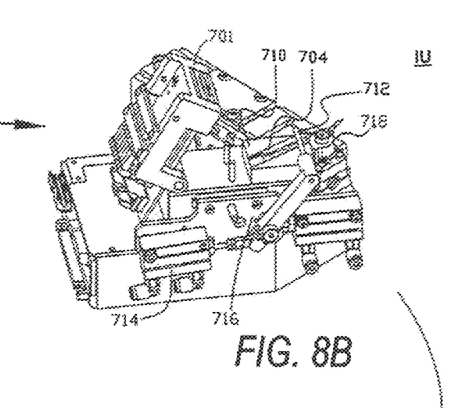
Figure 8C:
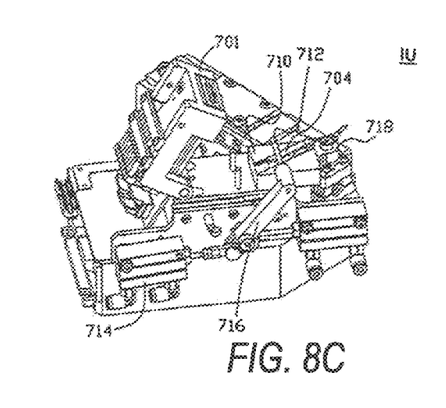

FIGS. 8A-8B show a rear side of an interconnection unit IU with moving part 701 being raised, so that a roller 712 may be seen. The roller 712 is moved by an air-operated actuator 714 through a lever 716. FIG. 8A shows the interconnection unit with the roller 712 in an initial position (top position). In the FIG. 8B the roller 712 has been moved down and is ready to flatten the HGA's flex circuit 112 in a depression 704 in the mounting surface of bench 710. A second depression in the mounting surface of bench 710, with a port to a selectively applied vacuum source, underlies to location where the head 102 of HGA is positioned. In FIG. 8C, the roller 712 has finished flattening of the flex circuit 112. As the roller 712 flattens the flex circuit 112, vacuum is applied to the port(s) in the second depression. At the last step of this procedure, the roller 712 is raised and returns to the position shown in FIG. 8A.

As it follows from the preceding description, the embodiment of the present invention not only places the boss hole 110 of the HGA in a desired (for testing) position, but also aligns the flex circuit 112 by turning the HGA to a necessary angle for a desired orientation. In that way, a displacement of flex circuit pads 118 relative to the preamplifier terminals, is corrected and the reason for unjustified rejection of tested heads is eliminated.

According to the present invention, a retractable pin 518 is introduced in the alignment table 316. After the alignment is accomplished, the retractable pin 518 is lowered to be beneath the upper surface of the alignment table 316. The delivery of vacuum to the vacuum inlets 410 stops, freeing the HGA. When the HGA is raised by the transporter 322 before the transfer to the mounting structure MS, there is neither contact nor friction between the inner surface of HGA boss hole 110 and the retractable pin 518. In that way, a cause of interference between the HGA and the pin, and consequent misalignment, is removed.

Although the foregoing description of the embodiment of the present invention contains some details for purposes of clarity of understanding, the invention is not limited to the detail provided. There are many alternative ways of implementing the invention. The disclosed embodiment is illustrative and not restrictive.

What is claimed is:

1. A head gimbal assembly (HGA) loader for providing a succession of HGAs to a magnetic head tester, wherein each HGA includes a planar base plate having a boss hole of radius R and disposed about a center point CP passing therethrough, a load arm extending from the base plate to a distal end thereof, a magnetic head affixed to the distal end of the load arm, an elongated circuit sheet element extending along a flex axis from the center point to the distal end of the sheet element, and array of electrical contact pads disposed at the distal end of the sheet element, herein the load beam and the base plate are relatively stiff compared to the sheet element, comprising:

A. a first workstation including an HGAs carrier affixed to a base, and including an upward-facing horizontal surface for receiving and storing in a single-layer array, a plurality of HGAs to be tested in succession;

B. a second workstation including an upward-facing planar annular alignment surface on an alignment table affixed to the base, and for receiving the HGAs one at a time from the HGA carrier and clamping each HGA as received to the alignment surface, wherein the alignment surface is rotatable about a vertical alignment axis;

C. a rotary actuator affixed to the base and coupled to the mounting surface to effect rotational displacement of the mounting surface about a vertical axis;

D. a third workstation including an HGA support assembly affixed to the base and including a planar HGA support surface disposed about a collet axis parallel to the alignment axis, and a clamp assembly for clamping a received HGA to the HGA support surface;

E. a digital camera configured to create an image of an HGA placed on the alignment table of the second workstation;

F. a transporter affixed to the base, and including a track overlying the base, and a carriage movable along the track to selectively overlie and face each of the first, second and third workstations, where the carriage includes a plurality of pickers for selectively attaching to an HGA to enable selective transfer of the respective HGAs from one of the workstations to another; and G. a controller is operative for each HGA on the HGA carrier, in succession, for providing control signals to the elements A-F to effect:

i. picking and transporting of the HGAs in succession, from the HGAs carrier to be received at the planar top surface of the alignment table with the boss holes of the respective HGAs centered about the alignment axis, ii. at the alignment table, maintaining the boss holes of the respective HGAs centered about the alignment axis, while rotating the planar top surface of the alignment table whereby the flex axes of the respective received HGAs are angularly positioned to the predetermined angular orientation about the alignment axis iii. picking and transporting of the HGAs in succession, while maintaining the flex axes of respective HGAs angularly positioned about an HGA transport axis parallel to the alignment axis at the same angular position as at the top surface of the alignment table, from the top surface of the alignment table, to be received at the annular planar HGA support surface of the HGA support assembly with the boss holes of the respective HGAs coaxial with the collet axis, iv. clamping the received succession of HGAs to the annular planar HGA support surface of the HGA support assembly with the boss holes of the respective HGAs disposed about the collet axis while maintaining the flex axes of respective HGAs angularly positioned about collet axis at the same angular position as at the top surface of the alignment table, and v. applying a test connector to the array of contact pads of the respective HGAs, and testing signals to, and receiving test result signals from, the array of contact pads of the respective HGAs.

2. An HGA loader for a magnetic head tester of claim 1, wherein the alignment table comprises:

i. the top surface disposed on a suction bushing (i) perforated by sucking conduits coupled to a vacuum inlet, (ii) including a central bore extending along the alignment axis, and (iii) configured to clamp an HGA which is received from the HGA carrier and lowered to the top surface of the suction bushing;

ii. a retracting pin with a tapered upper end, said retracting pin being seated in the central bore and positionable between an upper position where it protrudes above an upper surface of the suction bushing, and a lower position beneath the upper surface of the suction bushing;

iii. an air-operated actuator configured to move the retracting pin from the lower position to the upper position before an HGA is lowered at the alignment table and from the upper position to the lower position before the HGA is raised from the suction bushing.

3. An HGA loader for a magnetic head tester of claim 2, wherein the alignment table is configured to align the center point CP of the HGA boss hole with the alignment axis by moving the HGA boss hole into interfering engagement with the tapered end of the retractable pin of the alignment table.

4. An HGA loader for a magnetic head tester of claim 1, wherein the digital camera, the alignment table and the rotary actuator are configured to act together and to perform the angular alignment of the HGA by turning the alignment table together with the HGA through a corresponding angle.

5. An HGA loader for a magnetic head tester of claim 4, wherein the angular alignment of the HGA is performed as a sequence of the following operations:

a. producing by the digital camera an image of an HGA which has been placed at the alignment table;

b. comparing the current image of the HGA with a reference image having a desired alignment, and determining the angular discrepancy between the current image of the HGA on the alignment table, and the alignment of a desired reference image;

c. sending an instruction to the rotary actuator to turn the alignment table by an angle that corresponds to the determined angular discrepancy;

d. rotating the alignment table by the rotary actuator in accordance with the received instruction.

6. An HGA loader for a magnetic head tester of claim 5, wherein the image comparing sub-step b compares images of the HGA as a whole.

7. An HGA loader for a magnetic head tester of claim 5, wherein the image comparing sub-step b compares two or more discrete features of the images of the HGA.

8. An HGA loader for a magnetic head tester of claim 5, wherein the angular alignment of the HGA is stopped when the angular discrepancy between the current image and the reference image are matched within a predetermined tolerance.

9. An HGA loader for a magnetic head tester of claim 5, wherein the reference image is produced once for each type of magnetic heads by the following sequence of operation:

a. receiving an impression of the preamplifier terminals by pressing the preamplifier terminals to a pressure sensitive material placed in the mounting structure under the preamplifier terminals.

b. producing an image of the preamplifier terminals impression by the digital camera.

c. placing one of the HGAs of a set to be tested, at the alignment table and performing approximate alignment of the HGA.

d. transferring the HGA to mounting structure and producing it image by the digital camera.

e. Comparing the image of the HGA at the mounting structure with the image of the preamplifier terminals impression and measuring the angle $\phi$ between them.

f. transferring the HGA from the mounting structure to the alignment table with its position in the X-Y plane unchanged.

g. turning the alignment table together with HGA placed at it by the rotary actuator through an angle $\phi$, and h. saving the image of HGA, placed at the alignment table, in the memory of the computer, which is interacting with the magnetic head tester, as an HGA's reference image.

10. An HGA loader for a magnetic head tester of claim 9, wherein an approximate alignment of an HGA is performed by the following set of operation:

a. determining the expected location of the symmetry axis of base plate of the HGA in the reference position on the basis of relative disposal of the alignment table and the mounting assembly;

b. producing by the digital camera an image of the HGA that is transferred to the alignment table from the HGAs carrier;

c. comparing symmetry axis of the received image of the HGA with the expected location of the symmetry axis of base plate of HGA in the reference position and determining the angular discrepancy w between them;

d. rotating the alignment table by the rotary actuator by the angle w.

11. An HGA loader for a magnetic head tester of claim 1, wherein the mounting structure comprise a clamping unit, configured to clamp the base plate of the HGA to the clamping unit mounting surface, and an interconnection unit, configured to receive the HGA flex circuit, to flatten the HGA flex circuit and to connect the pads of the HGA flex circuit to the preamplifier terminals.

12. An HGA loader for a magnetic head tester of claim 11, wherein the interconnection unit comprises a moving part, which is able to turn up and down around horizontal axis and contains at its bottom surface the preamplifier terminals, said interconnection unit comprising a roller and a bench with a depression, floor of the depression being connected by sucking conduits to a vacuum inlet.

13. An HGA loader for a magnetic head tester of claim 12, wherein the interconnection unit is configured to establish the electrical connection between the pads of the HGA flex circuit and the preamplifier terminals by performing the following operations:
   a. turning the moving part of the interconnection unit into the upper position;
   b. placing the HGA flex circuit into the interconnection unit, flattening it and fastening to the mounting surface; and
   c. turning the moving part of the interconnection unit into the lower position and pressing the preamplifier terminals against the pads of the HGA flex circuit.

14. A head gimbal assembly (HGA) alignment table angularly aligning a head gimbal assembly (HGA) having a boss hole characterized by a radius R, for testing on a magnetic head tester, comprising:
   A. a base,
   B. a table rotatable about a vertical alignment axis with respect to the base, and including an upward-facing annular planar top surface extending about a central aperture characterized by radius R, and extending perpendicular to the alignment axis, for receiving an HGA and clamping the HGA as received to the top surface, and wherein the top surface and the table include a central bore extending from the base and along the alignment axis, and
   C. a cylindrical centering pin characterized by a side surface having a radius R, whereby the pin is slidable in the central bore along the alignment axis, and having a conic tapered upper end, said pin being seated in the central bore and slidingly positionable between an upper position where the tapered end and at least a portion of the side surface of the pin protrudes above the top surface, and a lower position where the tapered end is at least in part below the upper surface;
   D. an air-operated actuator configured to selectively move the centering pin within the central bore from the lower position to the upper position before an HGA is lowered at the top surface and from the upper position to the lower position before the HGA is raised from the suction bushing; and
   E. a rotary actuator for angularly displacing the table about the alignment axis.

15. A head gimbal assembly (HGA) alignment table according to claim 14, further comprising
   A. a camera and support assembly coupled the camera to the table, whereby the camera is aligned to generate images of HGAs on the top surface of the alignment table with a boss hole positioned over and about the tapered end of the centering pin,
   B. a comparator for comparing an image of an HGA on the top surface with a reference image representative of a desired angular orientation of the HGA, and in response thereto, driving the table to angular movement whereby the HGA is aligned with the reference image.

* * * * *